United States Patent
Li et al.

(10) Patent No.: US 11,257,750 B2
(45) Date of Patent: Feb. 22, 2022

(54) E-FUSE CO-PROCESSED WITH MIM CAPACITOR

(71) Applicant: International Business Machines Corporation, Armonk, NY (US)

(72) Inventors: Baozhen Li, South Burlington, VT (US); Chih-Chao Yang, Glenmont, NY (US); Jim Shih-Chun Liang, Poughkeepsie, NY (US); Ernest Y. Wu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/783,812

(22) Filed: Feb. 6, 2020

(65) Prior Publication Data

US 2021/0249348 A1 Aug. 12, 2021

(51) Int. Cl.
*H01L 23/522* (2006.01)
*H01L 23/525* (2006.01)
*H01L 23/528* (2006.01)
*H01L 49/02* (2006.01)

(52) U.S. Cl.
CPC ........ *H01L 23/5223* (2013.01); *H01L 23/528* (2013.01); *H01L 23/5226* (2013.01); *H01L 23/5256* (2013.01); *H01L 28/40* (2013.01); *H01L 28/60* (2013.01); *H01L 28/86* (2013.01)

(58) Field of Classification Search
CPC ........ H01L 28/60; H01L 28/40; H01L 28/86; H01L 21/76895; H01L 23/5223; H01L 23/5226; H01L 23/5256; H01L 23/528; H01L 23/5329
See application file for complete search history.

(56) References Cited

U.S. PATENT DOCUMENTS

| | | |
|---|---|---|
| 4,714,949 A | 12/1987 | Simmons et al. |
| 7,348,654 B2 | 3/2008 | Hsieh et al. |
| 7,759,768 B2 | 7/2010 | Barth et al. |
| RE41,684 E | 9/2010 | Fischer et al. |
| 8,164,120 B2 | 4/2012 | Omura |
| 9,385,079 B2 | 7/2016 | Chang et al. |
| 9,627,312 B2 | 4/2017 | Childs et al. |
| 9,899,467 B2 | 2/2018 | Chiou et al. |
| 10,014,252 B2 | 7/2018 | Chang et al. |

(Continued)

*Primary Examiner* — Galina G Yushina

(74) *Attorney, Agent, or Firm* — Scully, Scott, Murphy & Presser, PC; L. Jeffrey Kelly, Esq.

(57) ABSTRACT

Metal e-fuse structure formed during back-end-of-line during processing and integral with on-chip metal-insulator-metal (MIM) capacitor (MIMcap). The metal e-fuse structures are extensions of MIMcap electrodes and are structured to isolate BEOL MIM capacitors for trimming and/or to isolate shorted or rendered highly leaky due to in process, or service induced defects. In one embodiment, the method incorporates the integral, co-processed metal e-fuse in series between the MIM capacitor and an active circuit. When a high current passes through the e-fuse element, the e-fuse element is rendered highly resistive or electrically open thereby disconnecting the MIM capacitor or electrode plate from the active circuitry. The e-fuse structure may comprise a thin neck portion(s) or zig-zag neck portion that extend from an MIMcap electrode away from the MIMcap between two inter-level interconnect via structures.

20 Claims, 9 Drawing Sheets

(56) References Cited

U.S. PATENT DOCUMENTS

| | | | |
|---|---|---|---|
| 2015/0022938 A1* | 1/2015 | Okada | H01G 4/015 361/278 |
| 2015/0214150 A1* | 7/2015 | Chang | H01L 23/5223 257/529 |
| 2016/0049366 A1* | 2/2016 | Mikalo | H01L 23/5256 257/529 |
| 2019/0341347 A1* | 11/2019 | Li | H01L 23/5223 |

* cited by examiner ional chip. MIM capacitors are often integrated into a back-end-of-the-line (BEOL) metallization stack, at a position between an underlying first metallization layer and an overlying second metallization layer. When integrated, a MIM capacitor is commonly formed as a stacked structure including planar electrode plates.

E-FUSE CO-PROCESSED WITH MIM CAPACITOR

FIELD

The present application relates to an integrated circuit (IC) chip and a method of forming the same. More particularly, the present application relates to an IC chip including a back-end-of-the-line (BEOL) metal-insulator-metal (MIM) capacitor and an integrally formed e-fuse element co-processed with an MIMcap electrode.

BACKGROUND

On-chip capacitors including metal-insulator-metal (MIM) capacitors are essential for many semiconductor chips. For example, MIM capacitors are frequently utilized as decoupling capacitors for mitigating power supply or switching noise caused by changes in current flowing in an integrated chip. MIM capacitors are often integrated into a back-end-of-the-line (BEOL) metallization stack, at a positon between an underlying first metallization layer and an overlying second metallization layer. When integrated, a MIM capacitor is commonly formed as a stacked structure including planar electrode plates.

Current BEOL e-fuses use Cu wire or a via as a fuse element, and due to limitations of lithographic semiconductor device processing, the Cu efuse can not be made any smaller than the minimum line width, thereby requiring higher power (larger devices) to program. As a result, there is possibility of inflicting potential severe damage during programing, thereby requiring surrounding fuse protection. This currently requires the building of e-fuses at lower metal levels, where the spacing has higher demand for signal/power wiring.

SUMMARY

An e-fuse element for an on-chip MIM capacitor, the e-fuse element formed integral with a MIM capacitor plate.

An e-fuse element for an on-chip MIM capacitor, the e-fuse element connecting to and/or integral with a MIMcap plate electrode and co-processed during fabricating of the MIM capacitor at the MIM capacitor level.

A method of fabricating an eFuse with an MIMcap process without any extra lithographic mask and processing steps.

In the present application, a MIM capacitor is formed at a BEOL metallization stack and the metallization stack co-processing steps form an e-fuse to as part of the MIM capacitor.

In one aspect of the present application, a semiconductor structure is provided. The semiconductor structure comprises: a metal-insulator-metal (MIM) capacitor ("MIMcap") having a bottom electrode located on a topmost surface of a first dielectric material layer, a first capacitor dielectric located on the bottom electrode, a middle electrode located on the first capacitor dielectric, a second capacitor dielectric located on the middle electrode and a top electrode located on the second capacitor dielectric, a portion of the middle electrode in overlapped relation with a portion of the bottom electrode and a portion of the top electrode; a third dielectric material layer located over the MIM capacitor and the second dielectric material layer; a first upper interconnect structure extending through the third dielectric material layer, the second dielectric material layer and the first dielectric material layer to vertically contact a first lower interconnect structure embedded in a portion of a first dielectric material layer, wherein the first upper interconnect structure laterally contacts the middle electrode at a first end of the MIM capacitor; and a second upper interconnect structure extending through the third dielectric material layer, the second dielectric material layer and the first dielectric material layer to vertically contact a second lower interconnect structure embedded in another portion of the first dielectric material layer; and an integral portion of the middle electrode extending laterally beyond the first end of the MIM capacitor to define a fusing element, the fusing element having a first end portion laterally contacting the first upper interconnect structure and a second end portion laterally contacting second upper interconnect structure.

In another aspect of the present application, a semiconductor structure is provided. The structure includes a first metal-insulator-metal (MIM) capacitor ("first MIMcap") having a bottom electrode located on a topmost surface of a first dielectric material layer, a first capacitor dielectric located on the bottom electrode, a middle electrode located on the first capacitor dielectric, a second capacitor dielectric located on the middle electrode and a top electrode located on the second capacitor dielectric, a portion of the middle electrode in overlapped relation with a portion of the bottom electrode and a portion of the top electrode; a third dielectric material layer located over the MIM capacitor and the second dielectric material layer; a first conductive via structure extending through the third dielectric material layer, the second dielectric material layer and the first dielectric material layer to vertically contact a first lower interconnect structure embedded in a portion of a first dielectric material layer, wherein the first conductive via structure laterally contacts the middle electrode at a first end of the first MIM capacitor; a parallel-connected second MIMcap having a bottom electrode located on a topmost surface of a first dielectric material layer, a first capacitor dielectric located on the bottom electrode, a middle electrode located on the first capacitor dielectric, the second capacitor dielectric located on the middle electrode and a top electrode located on the second capacitor dielectric, a portion of the middle electrode in overlapped relation with a portion of the bottom electrode and a portion of the top electrode of the second MIMcap, the third dielectric material layer located over the second MIM capacitor and the second dielectric material layer; a second conductive via structure extending through the third dielectric material layer, the second dielectric material layer and the first dielectric material layer to vertically contact a second lower interconnect structure embedded in another portion of the first dielectric material layer, wherein the second conductive via structure laterally contacts the middle electrode at a first end of the first MIM capacitor; and the middle electrode of the first MIMcap and parallel connected second MIMcap being an integral unitary structure; and an integral portion of the middle electrode of the first MIMcap and parallel connected second MIMcap comprising a fusing element, the fusing element having a first end portion laterally contacting the first conductive via structure and a second end portion laterally contacting second conductive via structure.

DETAILED DESCRIPTION

Figure 1A:
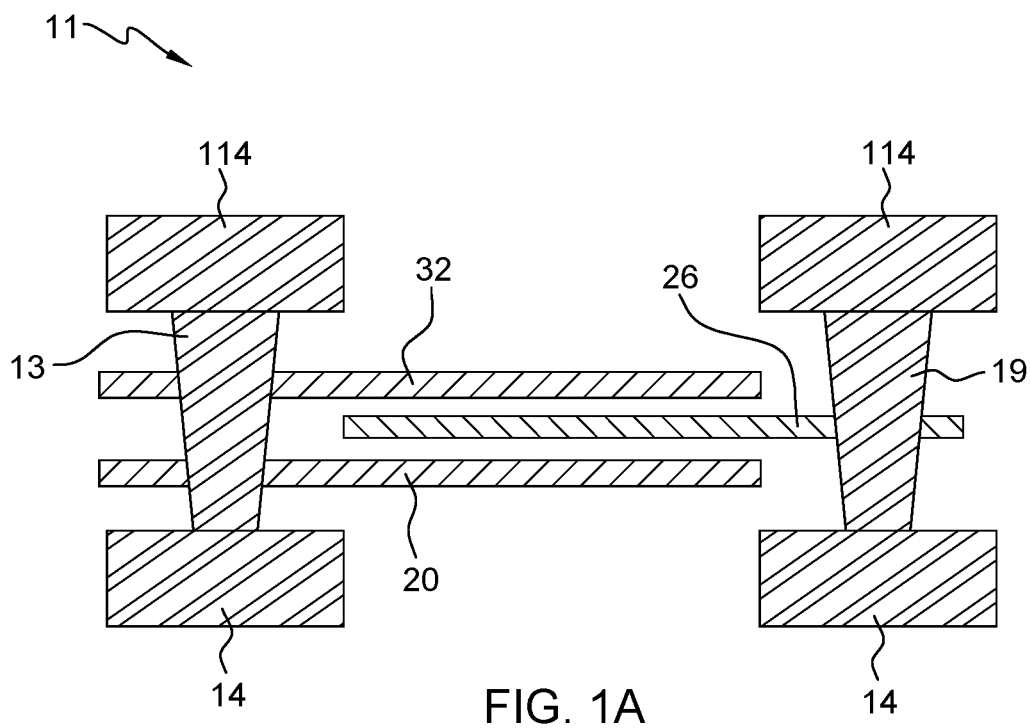
FIG. 1A, there is depicted a cross-sectional view of a MIM capacitor element that is formed at a MIMcap level using conventional semiconductor manufacturing techniques.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In an embodiment, the present disclosure is directed to an e-fuse element for an on-chip MIM capacitor, the e-fuse element connecting to and/or formed integral with a MIM capacitor plate electrode and is co-processed during fabricating of the MIM capacitor.

Referring to FIG. 1A, there is depicted a cross-sectional view of a MIM capacitor ("MIM cap") element 11 that is formed at a MIMcap level using conventional semiconductor manufacturing techniques, e.g., during back-end-of-line (BEOL) metallization fabrication processes. In the embodiment depicted in FIG. 1A, the formed MIMcap 11 has three plate electrodes 20, 26 and 32 although the concepts described herein are applicable during the fabrication of MIMcaps having two or more electrodes. In the MIMcap 11, plate electrodes 20, 32 are referred to as bottom and top electrodes connected to a first metal or metal alloy contact structure 13. The contact structure is a conductive via that provides a conductive path between electrically conductive metallization structure 14 at a first lower metallization level (Mx) and an electrically conductive metallization structure 114 at a second upper metallization level (Mx+1). In the MIMcap 11, plate electrode 26 is a middle plate electrode connected to a separate metal or metal alloy contact structure or via 19. The conductive contact via 19 provides a conductive path between other electrically conductive metallization structures 14 at a first lower metallization level (Mx) and an electrically conductive metallization structure 114 at an upper metallization level (Mx+1).

Figure 1B:
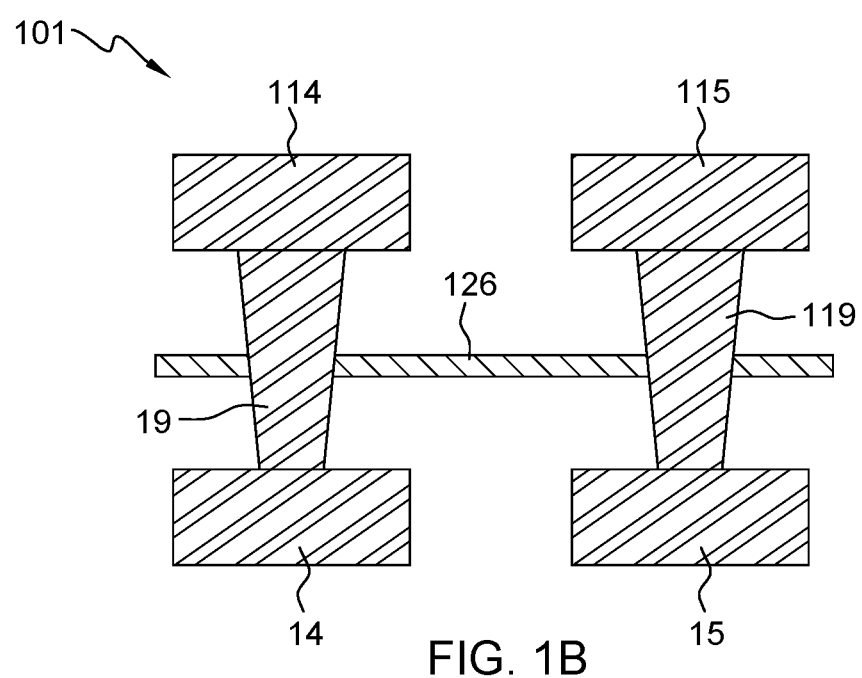
FIG. 1B depicts a cross-sectional view of an e-fuse element that is fabricated along with the MIMcap process and formed at the MIMcap level.

As shown in the cross-sectional view of FIG. 1B, without use of any extra processing steps, an e-fuse element 101 is fabricated along with the MIMcap process and formed at the MIMcap level. The e-fuse structure 101 uses one of the plate electrodes as a fusing element and is formed during the fabrication of the middle MIMcap plate electrode. For example, during the fabricating of the middle MIMcap electrode 26 of MIMcap 11, the metal material deposited to form middle plate electrode 26 further extends to and connects with a further metal or metal alloy contact structure or via 119 that provides a conductive path between other electrically conductive metallization structures 15 at a first lower metallization level (Mx) and an electrically conductive metallization structure 115 at an upper metallization level (Mx+1).

While embodiments herein refer to co-processing of e-fuse elements during fabrication of the MIMcap middle plate electrode, the following description is not limited to MIMcap mid plate electrode and is applicable to co-processing during fabrication of any plate electrodes of the MIMcap.

In an embodiment, the fabricated e-fuse element 126 is part of or otherwise connects to the MIMcap middle plate electrode 26 of MIMcap 11, and upon application of sufficient current, e.g., from a programmed current source, through via 119, can initiate a fusing such that e-fuse element 126 can disconnect or isolate the MIMcap 11 from any circuit it is connected with. In embodiments, an e-fuse element 126 connecting to one or more MIMcaps is used to trim MIMcap or isolate the MIMcap 11, e.g., if MIMcap 11 is determined defective.

Figure 2A:
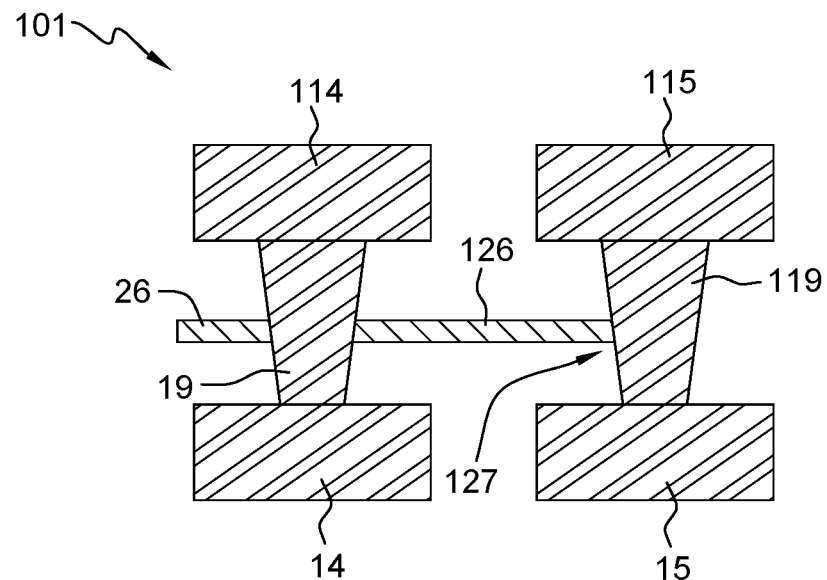
FIG. 2A depicts a cross-sectional view of an embodiment of the e-fuse element co-processed with the fabrication of the MIMcap middle plate electrode of MIMcap of FIG. 1A.

Referring now to FIG. 2A, there is depicted a cross-sectional view of an embodiment of the e-fuse element 126 of FIG. 1A or 1B, co-processed with the fabrication, i.e., masking, patterning and etching process of the MIMcap middle plate electrode 26 of MIMcap 11 of FIG. 1A. In an embodiment, the e-fuse element 126 and middle electrode of 26 both connects to a common via 19 providing the conductive path between conductive metallization structures Mx 14 and Mx+1 114. In embodiments, the common via 19 may connect to multiple MIMcaps 11.

Figure 2B:
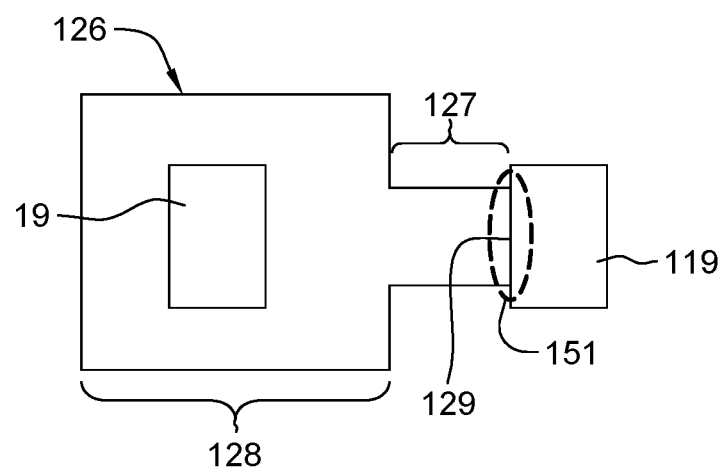
FIG. 2B shows a top down view of an embodiment of the e-fuse element of FIG. 2A.

FIG. 2B shows a top down view of an embodiment of the e-fuse element 126 of FIG. 2A formed during the processing of the MIMcap middle electrode(s) 26 of FIG. 1A. That is, in the embodiment depicted, the e-fuse element 126 is connected between both the metal or metal alloy contact via 19 connecting to one or more middle MIMcap plate electrodes of MIM capacitor(s) 11 and to the further metal or metal alloy contact via 119. In the embodiment depicted, this e-fuse element 126 is fabricated during processing of plate electrode 26 of MIMcap(s). As shown in FIG. 2B, the e-fuse element 126 is constructed from the MIMcap mid-plate electrode material to include a via contact portion 128 corresponding to a MIMcap plate electrode and an e-fuse element portion 127 having a width dimensioned thinner via mask patterning and etching processes when forming the mid-plate electrode 26. The e-fuse element portion 127 of e-fuse element 126 has a peripheral edge 129 that physically contacts only one side of the further via 119 at a small via-plate contact location 151 at the periphery or edge of the via 119. In operation, a sufficient amount of electrical current conducted through via 119 will initiate the fusing (blowing) at the small via-plate contact location 151 to isolate or trim any of the MIMcap(s) 11 having electrodes connected at the via 19.

In view of FIG. 2B, in an embodiment, the width dimension of the contacting edge 129 of e-fuse element portion 127 that contacts the via 119 is dimensioned smaller than width of the via 119 at the via-plate contact location 151. In embodiments, the width or area of the contacting edge 129 of e-fuse element portion 127 can be 50% smaller than the width or area of the contacting via 119 or greater, as long as the contacting width is less than or equal to the width of the contact via 119 at the via-plate contact location 151 so as to initiate low power fusing.

Figure 3A:
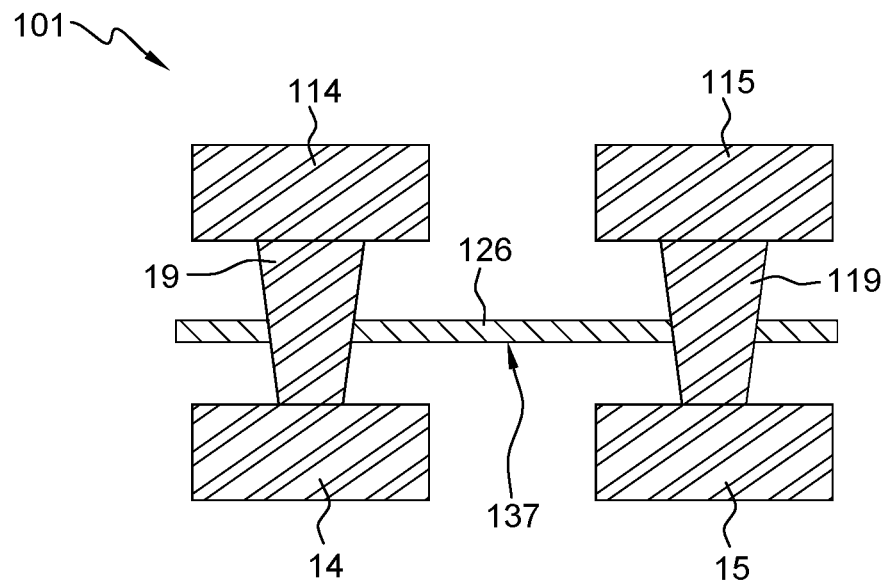
FIG. 3A depicts a cross-sectional view of a further embodiment of the e-fuse element co-processed with the fabrication of the MIMcap middle plate electrode of MIMcap of FIG. 1A.
Figure 3B:
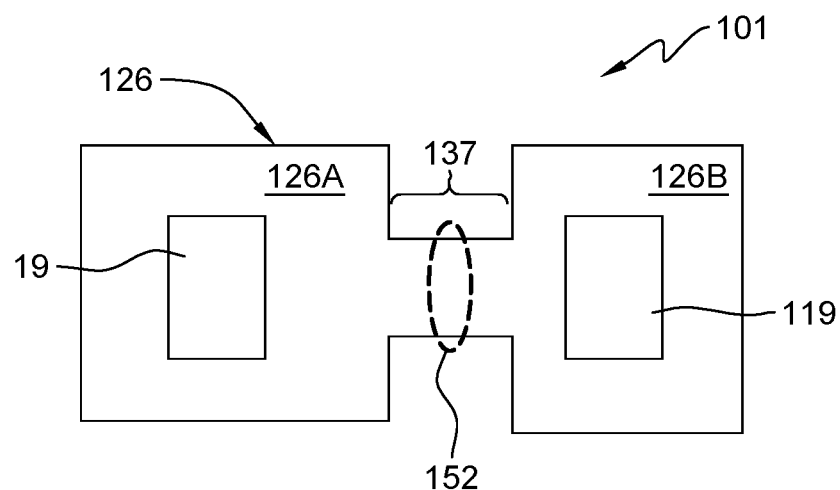
FIG. 3B shows a top down view of the further embodiment of the e-fuse element of FIG. 3A.

In an embodiment depicted in a cross-sectional view of FIG. 3A and the top-down view of FIG. 3B, the e-fuse element 126 corresponding to MIMcap mid-plate electrode 26 is constructed with a fuse element neck portion 137 such that application of sufficient current can initiate fusing at a fuse location along the neck and away from the via-plate contact area of FIG. 2B. In the non-limiting embodiment depicted, this e-fuse element 126 includes an e-fuse element neck portion 137 that provides a fusing location 152 between the via 19 connecting one or more MIMcap mid-plate electrodes 26 and the further via contact 119. In view of FIG. 3B, in an embodiment, the e-fuse element 126 is constructed during construction of the MIMcap mid-plate electrodes 26 using deposition, mask patterning and etching processes that are adapted to form an e-fuse element neck portion 137 having a width dimensioned thinner than the remaining portions 126A and 126B of the e-fuse element 126 that fully connect vias 19 and 119. As shown, each of the portions 126A and 126B of the e-fuse element 126 contact all sides of the respective vias 19 and 119. As in the prior embodiments, the width of the e-fuse element neck portion 137 can be 50% smaller than the width of the via 19, 119 or greater, as long as the width of neck portion 137 is less than or equal to the width of the via 119, upon receipt of sufficient low power electrical current through via 119, any fusing at fusing location 152 occurs away from a via-plate contact area.

Figure 4A:
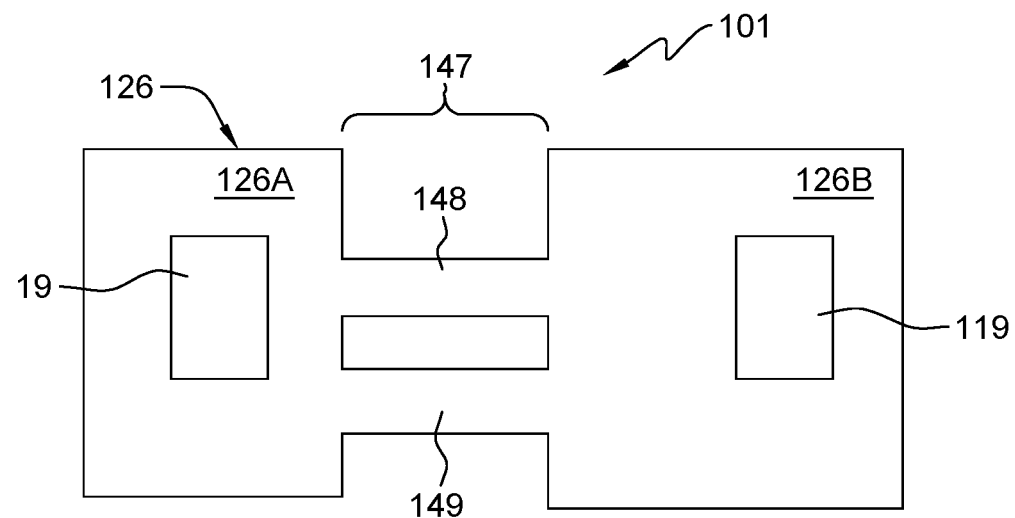
FIG. 4A shows a top-down view of a first alternate structure of the e-fuse element of the embodiment depicted in FIG. 3B.
Figure 4B:
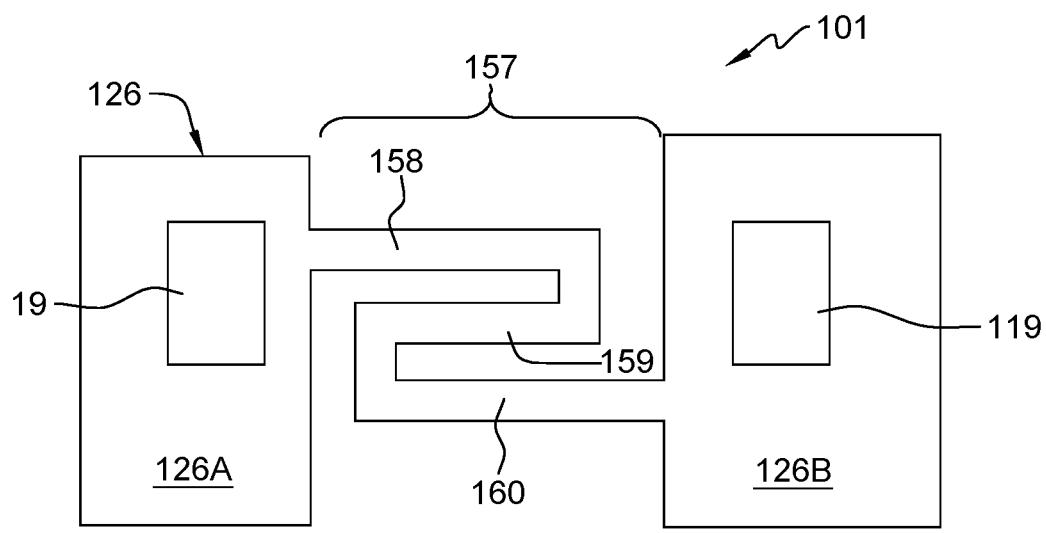
FIG. 4B shows a top-down view of a second alternate structure of the e-fuse element of the embodiment depicted in FIG. 3B.

FIG. 4A shows a top-down view of a first alternate structure of the e-fuse element 126 of FIG. 3B that is constructed with a fuse element portion 147 that includes one or more thinner neck portions 148, 149. Although two neck portions are shown in FIG. 4B, the e-fuse element portion 147 can include more than two thin neck portions. In view of FIG. 4A, in an embodiment, the e-fuse element 126 is constructed during construction of the MIMcap mid-plate electrodes 26 using deposition, mask patterning and etching processes that are adapted to form two (or more) thinner e-fuse element neck portions 148, 149 each having a width dimensioned thinner than the respective portions 126A and 126B of the e-fuse element 126 that fully connect respective vias 19 and 119. That is, as in the embodiment depicted in FIG. 3B, each of the portions 126A and 126B of the e-fuse element 126 contact all sides of the respective vias 19 and 119. As in the prior embodiments, the width of the individual e-fuse element neck portions 148, 149 can be 50% smaller than the width of the via(s) 19, 119 or greater, as long as the sum of the widths of each neck of neck portion 147 is less than the width of the via 119 such that application of sufficient current through via 119 can initiate fusing at a fuse location along each neck portion 148, 149.

FIG. 4B shows a top-down view of a second alternate structure of the e-fuse element 126 of FIG. 3B that is constructed with a single thin fuse element portion 157 that is zig-zag or serpentine shaped. In particular, the thinner neck portion 157 is shaped as a "zig-zag" having a first conductive line portion 158 extending from the first portion of e-fuse element plate portion 126A fully contacting the via 19 that is shared with other MIMcap mid-plate conductors 26, and a connecting middle line portion 159 that connects the first line conductive line portion 158 to a second conductive line portion 160 extending to the second portion of e-fuse element plate portion 126B fully contacting the via 119. As shown, the conductive line portions 158, 159 and 160 making up the zig-zag shaped thinner neck portion 157 includes linear portions that laid out in a parallel orientation, e.g., substantially overlap, such as shown in FIG. 4B. As in the prior embodiments, the width of the individual e-fuse element neck portions 158, 159, 160 can be 50% smaller than the width of the via(s) 19, 119 or greater, as long as the width of each linear portion is less than the width of the via 19, 119 such that application of sufficient current through via 19, 119 can initiate fusing at a fuse location along each neck portion 158, 159 or 160.

As in the embodiment depicted in FIG. 4A, the e-fuse element 126 is constructed during construction of the MIMcap mid-plate electrodes 26 using deposition, mask patterning and etching processes that are adapted to form the thinner e-fuse element zig-zagging linear neck portions 158, 159, 160 of neck portion 157. Each thinner e-fuse element zig-zagging linear neck portions 158, 159, 160 have a width dimensioned thinner, e.g., up to the lithographic limit, than the respective portions 126A and 126B of the e-fuse element 126 that fully connect respective vias 19 and 119. That is, as in the embodiment depicted in FIG. 4B, each of the portions 126A and 126B of the e-fuse element 126 contact all sides of the respective vias 19 and 119. As in the prior embodiments, the width of the individual e-fuse element zig-zagging linear neck portions 158, 159, 160 can be 50% than the width of the via 19, 119 or greater, as long as an application of sufficient current through via 119 can initiate fusing at a fuse location along neck portion 157. In an embodiment, in operation, application of a low power current through via 119 can heat elements 158, 159, 160 such that heat generated by elements 158 and 160 can contribute to and accelerate the heating of the neck portion 159 and cause a fusing of the e-fuse element 126 along the middle portion 159 of the neck 157.

Figure 5A:
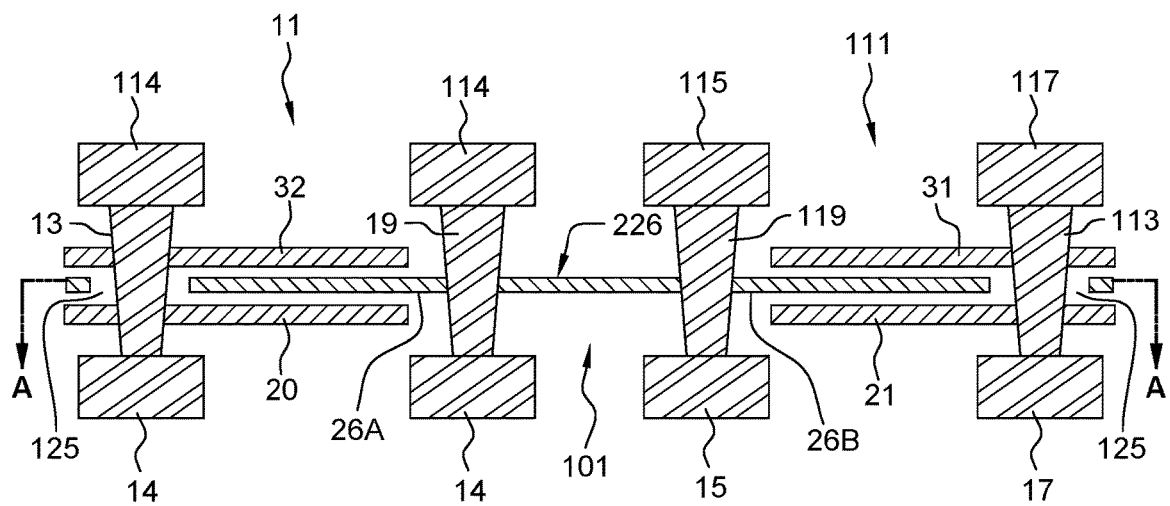
FIG. 5A depicts a cross-sectional view of two MIM capacitor elements having a common capacitor plate electrode and an integral e-fuse element formed therebetween at the MIMcap level.

Referring now to FIG. 5A, there is depicted a cross-sectional view of two MIM capacitor elements 11 and 111 and an e-fuse element 101 that are formed at a MIMcap level using conventional semiconductor manufacturing techniques, e.g., during back-end-of-line (BEOL) metallization fabrication processes. In the embodiment depicted in FIG. 5A, the formed MIMcap 11 is as shown in FIG. 1A having three plate electrodes including bottom and top plate electrodes 20 and 32 and a mid-plate electrode 26A, and the formed MIM cap 111 includes three plate electrodes including bottom and top electrodes 21 and 31 and a middle (mid-plate) electrode 26B. The mid-plate electrode 26A of MIMcap 11 and mid-plate electrode 26B of MIMcap 111 are formed as part of a single integral e-fuse element structure 226. As shown in the top-down view of FIG. 5B, e-fuse element structure 226 is fabricated to include a thin neck portion 237 formed between metal or metal alloy vias 19 and 119 as in the embodiment depicted in FIG. 3B. Thus, given the common e-fuse element structure 226 connecting the MIMcap mid-plate electrodes 26A, 26B, the MIMcaps 11, 111 are configured as a parallel circuit. As in the embodiment of FIG. 3B, thin neck fuse portion 237 of e-fuse element structure 226 provides a fusing location 252, as in the prior embodiments, that is dimensioned to blow upon application of sufficient programmed current through vias 19, 119 to isolate or trim one or the other MIMcap 11, 111 from a circuit.

Figure 5B:
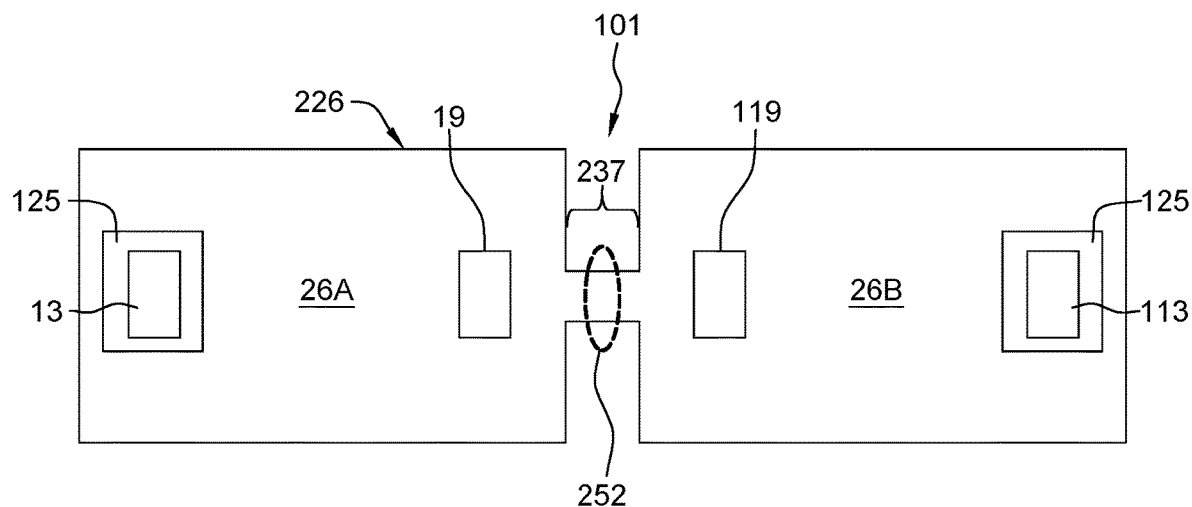
FIG. 5B depicts a top-down view of the common capacitor plate electrode and an integral e-fuse element structure taken along line A-A in the embodiment depicted in FIG. 5A.

In the embodiment of FIG. 5A, MIMcap 11 bottom and top plate electrodes 20, 32 each connect to a first metal or metal alloy contact structure 13 providing the conductive path between electrically conductive metallization structure 14 at a first lower metallization level (Mx) and an electrically conductive metallization structure 114 at a second upper metallization level (Mx+1). In the MIMcap 11, mid-plate electrode 26A connects to a second separate metal or metal alloy contact structure or via 19 that provides a conductive path between other electrically conductive metallization structures 14 at a first lower metallization level (Mx) and an electrically conductive metallization structure 114 at an upper metallization level (Mx+1). However, as shown in FIG. 5B, the mid-plate electrode 26A is formed with a cut-out region 125 to surround the first via structure 13 and avoid contacting it. Similarly, formed at the same time, parallel connected MIMcap 111 outer plate electrodes 21, 31 each connect to a fourth metal or metal alloy contact structure 113 providing the conductive path between another electrically conductive metallization structure 17 at a first lower metallization level (Mx) and an electrically conductive metallization structure 117 at a second upper metallization level (Mx+1). In the MIM cap 111, mid-plate electrode 26B connects to a third separate metal or metal alloy contact structure or via 119 that provides a conductive path between other electrically conductive metallization structures 15 at a first lower metallization level (Mx) and an electrically conductive metallization structure 115 at an upper metallization level (Mx+1). However, as shown in FIG. 5B, the mid-plate electrode 26B is also formed with a cut-out region 125 to surround the fourth via structure 113 and avoid contacting it.

The e-fuse element 226 that includes thin neck portion 237 providing a fusing location 252 is fabricated at the same time with the processing to form mid-plate electrodes 26A, 26B of respective MIMcaps 11, 111 with patterning, masking and etching steps that result in forming the thin neck portion 237 connecting the respective mid-plate electrodes 26A, 26B and each of the cut-out regions 125 therein. It is understood that the neck portion connecting each of the mid-plate electrodes 26A, 26B can include multiple (e.g., two or more) thinner neck portions and/or the zig-zag shaped fuse element portions such as shown in the embodiments of FIG. 4A, 4B.

Though the above examples show how to use the e-fuse to program MIMcaps, the e-fuse can be used to program any other circuits, such as memory blocks, as well.

The following description depicts the process steps for manufacturing a MIMcap and highlight the co-processing steps for fabricating the e-fuse element 101 of FIGS. 1A-5B.

Figure 6:
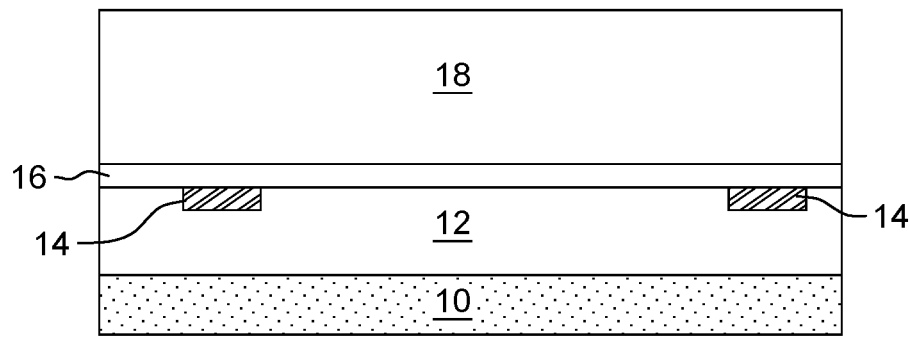
FIG. 6 is a cross sectional view of an exemplary integrated circuit (IC) chip during an early stage of fabrication, wherein the IC chip includes a semiconductor substrate, an interconnect level including electrically conductive structures embedded in an interconnect dielectric material layer, a dielectric capping layer, and a first interlayer dielectric (ILD) material layer.
Figure 12:
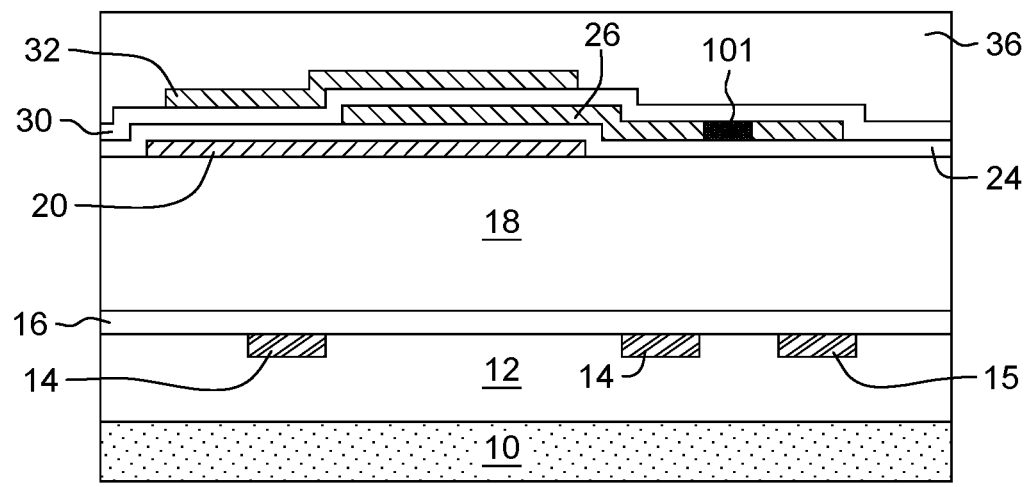
FIG. 12 is a cross sectional view of the exemplary IC chip of FIG. 11 expanded to show an additional electrically conductive structure formed embedded in another portion of an interconnect dielectric material layer and after forming a second interlayer dielectric (ILD) material layer above the third electrode and second capacitor dielectric material layer.

Referring first to FIG. 6, there is illustrated an exemplary integrated circuit (IC) chip of the present application during an early stage of fabrication. The exemplary IC chip of FIG. 6 includes a semiconductor substrate 10, an interconnect level including electrically conductive structures 14 embedded in an interconnect dielectric material layer 12, a dielectric capping layer 16, and a first interlayer dielectric (ILD) material layer 18. In some embodiments, dielectric capping layer 16 may be omitted. Although the present application describes and illustrates a single interconnect level, the present application contemplates embodiments in which a plurality of interconnect levels are formed one atop the other, wherein each interconnect level includes an interconnect dielectric material layer having a plurality of electrically conductive structures embedded therein. For example, as shown in FIG. 12, an additional electrically conductive structure 15 is formed embedded in another portion of an interconnect dielectric material layer 12 beyond the conductive structure 14.

The semiconductor substrate 10 that may be employed in the present application includes at least one semiconductor material having semiconducting properties. Examples of semiconductor materials that can be employed include, for example, silicon (Si), germanium (Ge), a silicon germanium (SiGe) alloy, silicon carbide (SiC), silicon germanium carbide (SiGeC), a III-V compound semiconductor or a II-VI compound semiconductor. The semiconductor substrate may be a bulk semiconductor substrate or a semiconductor-on-insulator (SOI) substrate. A bulk semiconductor substrate is composed entirely of at least one semiconductor material, while an SOI substrate includes an insulator layer (such as, for example, silicon dioxide and/or boron nitride) located between a topmost semiconductor material and a handle substrate; the handle substrate is typically composed of a semiconductor material as well.

Although not illustrated in the drawings, one or more semiconductor devices may be disposed on, and/or within, a surface of the semiconductor substrate 10. The one or more semiconductor devices may include, for example, transistors, capacitors and/or diodes. The one or more semiconductor devices may be formed utilizing techniques well known to those skilled in the art.

The interconnect dielectric material layer 12 may be composed of an inorganic dielectric material or an organic dielectric material. In some embodiments, the interconnect dielectric material layer 12 may be porous. In other embodiments, the interconnect dielectric material layer 12 may be non-porous. Examples of suitable dielectric materials that may be employed as the interconnect dielectric material layer 12 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material layer 12 may have a dielectric constant (all dielectric constants mentioned herein are measured relative to a vacuum, unless otherwise stated) that is about 4.0 or less. In one embodiment, the interconnect dielectric material layer 12 has a dielectric constant of 2.8 or less. These dielectrics generally having a lower parasitic cross talk as compared to dielectric materials whose dielectric constant is greater than 4.0.

The interconnect dielectric material layer 12 may be formed by a deposition process such as, for example, chemical vapor deposition (CVD), plasma enhanced chemical vapor deposition (PECVD) or spin-on coating. The interconnect dielectric material layer 12 may have a thickness from 50 nm to 250 nm. Other thicknesses that are lesser than 50 nm, and greater than 250 nm can also be employed in the present application.

Electrically conductive structures 14 are then formed into the interconnect dielectric material layer 12. The electrically conductive structures 14 have a topmost surface that is coplanar with a topmost surface of the interconnect dielectric material layer 12. The electrically conductive structures 14 may extend throughout the entire thickness of the interconnect dielectric material layer 12 and contact a surface of the one or more semiconductor devices. For example, and when transistors are used as the one or more semiconductor devices, the electrically conductive structures 14 may contact a surface of each source/drain region and/or a surface of the gate electrode.

The electrically conductive structures 14 may be formed by providing openings (not shown) in the interconnect dielectric material layer 12, and then filling the openings with an electrically conductive metal or metal alloy. The openings that are formed into the interconnect dielectric material layer 12 may be via openings, line openings and/or combined via/line openings. The openings may be formed by lithography and etching. In embodiments in which a combined via/line opening is formed, a second iteration of lithography and etching may be used to form such a combined via/line opening. After forming the openings, the openings are filled with an electrically conductive metal or metal alloy. Examples of electrically conductive metals include, for example, copper (Cu), aluminum (Al), tungsten (W), or cobalt (Co). An example of an electrically conductive metal alloy that can be used is a copper-aluminum alloy. The electrically conductive metal or metal alloy may be formed utilizing a deposition process such as, for example, CVD, PECVD, sputtering, chemical solution deposition or plating. In one embodiment, a bottom-up plating process can be employed in filling each opening. In some embodiments, a planarization process such as, for example, chemical mechanical polishing (CMP) may follow the deposition of the electrically conductive metal or metal alloy.

In embodiments in which dielectric capping layer 16 is present, the dielectric capping layer 16 can be formed on the physically exposed topmost surface of the interconnect level (12/14). The dielectric capping layer 16 may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric material that provides the dielectric capping layer 16 may be formed utilizing a deposition process such as, for example, CVD, PECVD, atomic layer deposition (ALD), chemical solution deposition or evaporation. When present, dielectric capping layer 16 may have a thickness from 10 nm to 100 nm. Other thicknesses that are lesser than 10 nm, or greater than 100 nm may also be used as the thickness of the dielectric capping layer 16. The dielectric capping layer 16 is typically compositionally different from the interconnect dielectric material layer 12 and the first interlayer dielectric (ILD) material layer 18 to be subsequently formed.

The first ILD material layer 18 is then formed either on a physically exposed surface of the dielectric capping layer 16, or a physically exposed surface of the interconnect level (12/14). The first ILD material layer 18 may include one of the dielectric materials mentioned above for the interconnect dielectric material layer 12. In one embodiment, the first ILD material layer 18 may be composed of a same dielectric material as the interconnect dielectric material layer 12. In another embodiment, the first ILD material layer 18 may be composed of a different dielectric material than the interconnect dielectric material layer 12. The first ILD material layer 18 may be formed by a deposition process such as, for example, CVD, PECVD or spin-on coating. The first ILD material layer 18 may have a thickness from 50 nm to 250 nm. Other thicknesses that are lesser than 50 nm, and greater than 250 nm can also be employed in the present application. It is noted that first ILD material layer 18 and the second ILD material layer 36 to be formed in a later processing step of the present application, may collectively be referred to herein as a via ILD material which houses the MIM capacitor of the present application, as well as, the metal or metal alloy contact structures 36 (to be formed in a later processing step of the present application).

Figure 7:
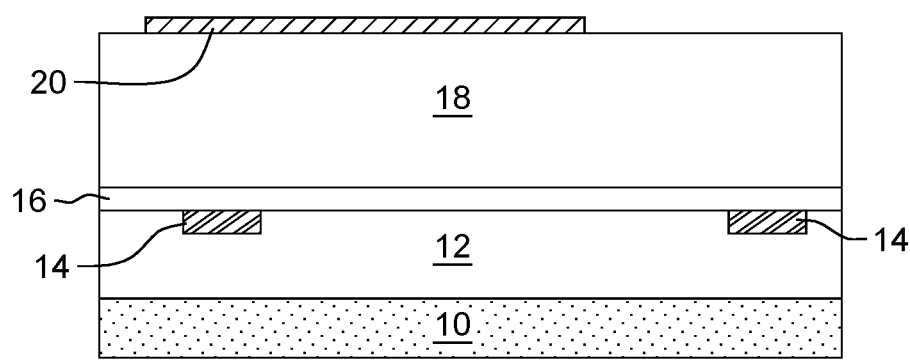
FIG. 7 is a cross sectional view of the exemplary IC chip of FIG. 6 after forming a first electrode of a metal-insulator-metal (MIM) capacitor.

Referring now to FIG. 7, there is illustrated the exemplary IC chip of FIG. 6 after forming a first electrode 20 of a metal-insulator-metal (MIM) capacitor of the present application. In the illustrated embodiment, the first electrode 20 is formed by providing a first electrode-containing material layer on a physically exposed surface of the first ILD material layer 18, and then patterning the first electrode-containing material layer by lithography and etching.

The first electrode-containing material layer that is used in providing the first electrode 20 may be composed of a conductive metal or conductive metal nitride. Exemplary conductive materials that may be used as the first electrode-containing material layer may include titanium (Ti), titanium nitride (TiN), tantalum (Ta), tantalum nitride (TaN), or copper (Cu), aluminum (Al), or tungsten (W). The first electrode-containing material layer can be formed utilizing a deposition process including, for example, CVD, PECVD, physical vapor deposition (PVD), ALD, sputtering, or other like deposition processes. The first electrode-containing material layer that is used in providing the first electrode 20 may have a thickness from 10 nm to 50 nm; although other thicknesses are contemplated and can be used in the present application.

In the formation of MIM plate electrode 20 the patterning, masking and etching process steps applied to the electrode-containing material layer can be further adapted to form an e-fuse structure dimensioned to provide a fusing location at or near the plate electrode 20. In embodiments, during the patterning of the MIMcap electrode 20 by lithography the via plate e-fuse contact portion and or neck e-fuse structures of FIGS. 1A-5B are patterned and etching is used to form the e-fuse contact portion and or neck e-fuse structures 101 such that an open occurs at the fusing location(s) defined by the e-fuse structures when a high current passes therethrough thereby disconnecting the MIM capacitor or electrode plate from the active circuitry. In this embodiment, the e-fuse structure(s) 101 can be formed as an extension of the electrode 20 beyond the electrode connection to an inter-level interconnect via.

Figure 8:
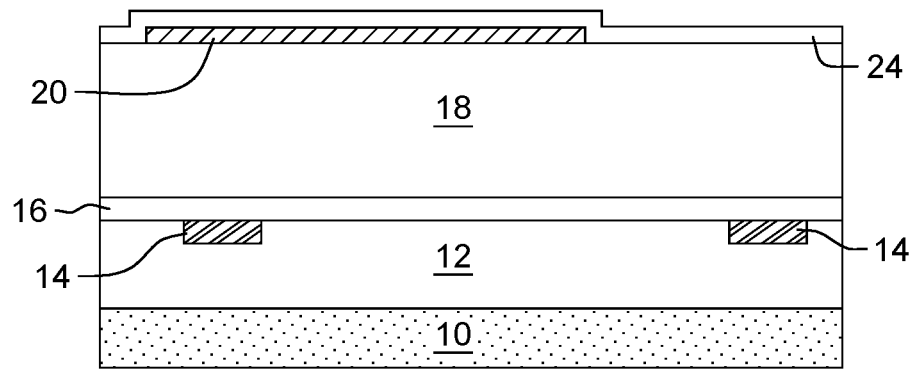
FIG. 8 is a cross sectional view of the exemplary IC chip of FIG. 3 after forming a first MIMcap dielectric material layer on the first electrode and interconnect dielectric material layer.

Referring now to FIG. 8, there is illustrated the exemplary IC chip of FIG. 7 after forming a first capacitor dielectric material layer 24 on the first electrode 20; the first capacitor dielectric material layer 24 is a continuous layer and thus it is also formed on any exposed surface of the underlying first ILD material layer 18. The first capacitor dielectric material layer 24 may include a dielectric oxide, a dielectric nitride, a dielectric oxynitride, or a composite stack layer thereof. In one example, the first capacitor dielectric material layer 24 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered dielectric structure comprising different dielectric materials, e.g., silicon dioxide, and a high-k dielectric, can be formed and used as the first capacitor dielectric material layer 24.

The first capacitor dielectric material layer 24 can be formed by any deposition process including, for example, CVD, PECVD, PVD, ALD, spin on or sputtering. In one embodiment of the present application, the dielectric material used in providing the first capacitor dielectric material layer 24 can have a thickness in a range from 1 nm to 10 nm. Other thicknesses that are lesser than, or greater than, the aforementioned thickness range can also be employed for the dielectric material that may provide the first capacitor dielectric material layer 24.

Figure 9:
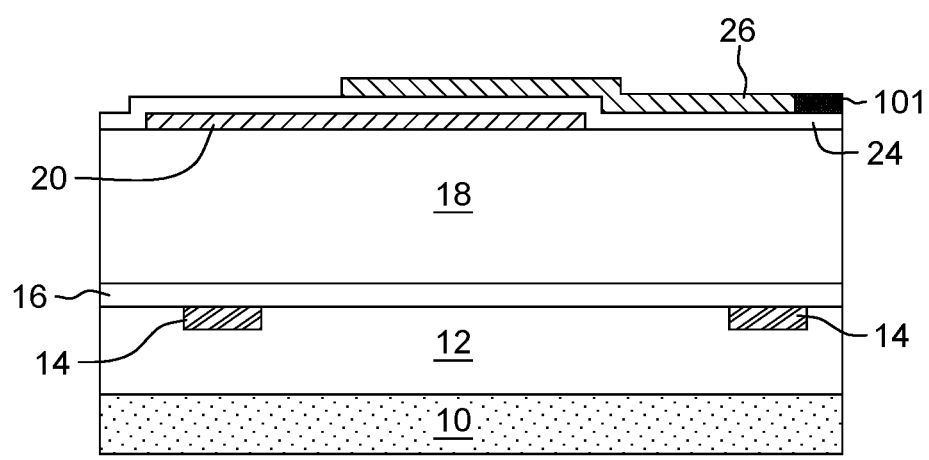
FIG. 9 is a cross sectional view of the exemplary IC chip of FIG. 8 after forming a second electrode on the first MIMcap dielectric material layer overlapping the first electrode and depicting a formed e-fuse structure co-processed therewith.

Referring now to FIG. 9, there is illustrated the exemplary IC chip of FIG. 8 after forming a second electrode 26. In the illustrated embodiment, the second electrode 26 is formed utilizing the technique mentioned above in forming the first electrode 20.

Notably, the second electrode 26 is formed by providing a second electrode-containing material layer on a physically exposed surface of the first capacitor dielectric material layer 24, and then patterning the second electrode-containing material layer by lithography and etching. The second electrode-containing material layer that is used in providing the second electrode 26 may be composed of one of the conductive metals or conductive metal nitrides mentioned above for the first electrode-containing material layer. In one embodiment, the second electrode-containing material layer that provides the second electrode 26 is composed of a same conductive material as the first electrode-containing material layer that provides the first electrode 20. In another embodiment, the second electrode-containing material layer that provides the second electrode 26 is composed of a different conductive material than the first electrode-containing material layer that provides the first electrode 20. The second electrode-containing material layer that is used in providing the second electrode 26 may have a thickness from 10 nm to 50 nm; although other thicknesses are contemplated and can be used in the present application.

In the forming of MIM plate electrode 26 the patterning, masking and etching process steps applied to the electrode-containing material layer are further adapted to form an e-fuse structure 101 dimensioned to provide a fusing location at or near the plate electrode 26. In embodiments, during the patterning of the MIMcap middle electrode 26 by lithography the via plate e-fuse contact portion and or neck e-fuse structures of FIGS. 1A-5B are patterned and etching is used to form the e-fuse via-plate contact portion or neck e-fuse structures 101 such that an open occurs at the fusing location(s) defined by the e-fuse structures when a high current passes therethrough thereby disconnecting the MIM capacitor or electrode plate from the active circuitry. In this embodiment, as further shown in FIG. 13, the e-fuse structure 101 is formed at an extension of the electrode 26 beyond the electrode connection to inter-level interconnect via 19 and between the adjacent via connection inter-level interconnect via 119.

Figure 10:
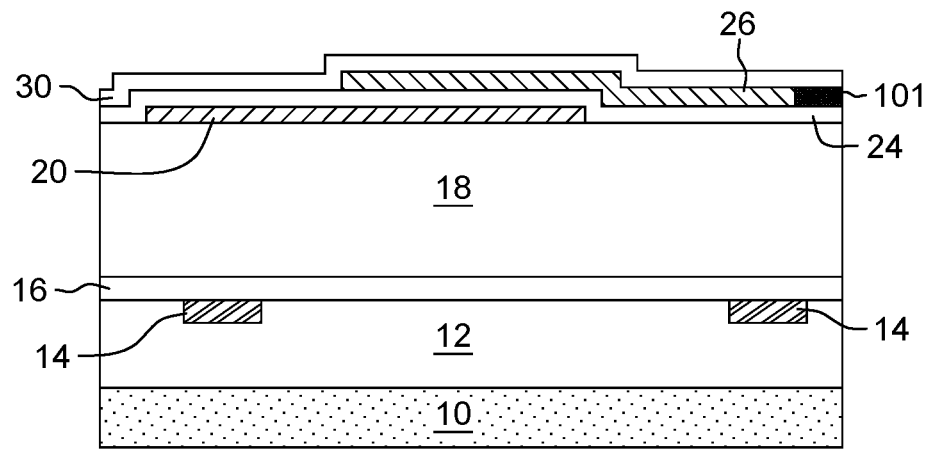
FIG. 10 is a cross sectional view of the exemplary IC chip of FIG. 9 after forming a second capacitor dielectric material layer on top the second electrode, the formed e-fuse structure, and the first capacitor dielectric material layer.

Referring now to FIG. 10, there is illustrated the exemplary IC chip of FIG. 9 after forming a second capacitor dielectric material layer 30 on the second electrode 26; the second capacitor dielectric material layer 30 is a continuous layer thus it also present on any exposed surface of the first capacitor dielectric material 24.

The second capacitor dielectric material layer 30 can be composed of one of the dielectric materials mentioned above for the first capacitor dielectric material layer 24. In one embodiment, the second capacitor dielectric material layer 30 is composed of a same dielectric material as the first capacitor dielectric material layer 24. In another embodiment, the second capacitor dielectric material layer 30 is composed of a different dielectric material than the first capacitor dielectric material layer 24. The second capacitor dielectric material layer 30 may be formed utilizing one of the deposition processes mentioned above for providing the first capacitor dielectric material layer 26. Also, the second capacitor dielectric material layer 30 may have a thickness within the range mentioned above for the first capacitor dielectric material layer 26.

Figure 11:
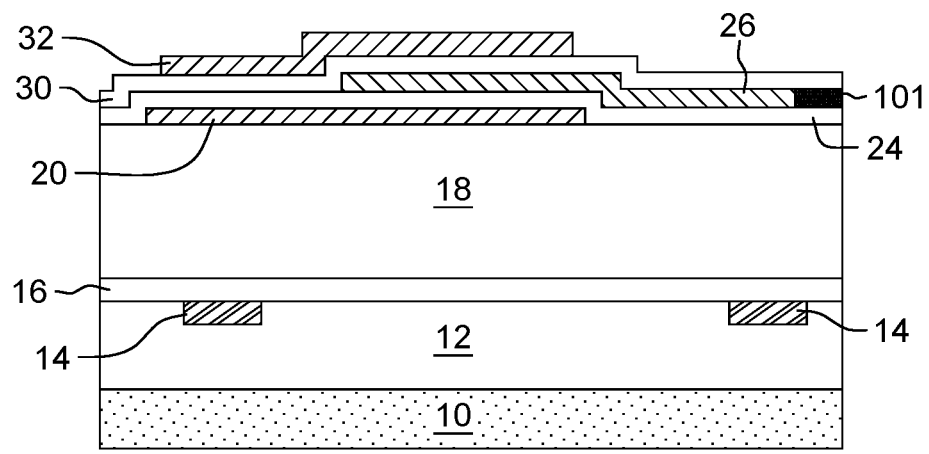
FIG. 11 is a cross sectional view of the exemplary IC chip of FIG. 10 after forming a third electrode on the second capacitor dielectric material layer.

Referring now to FIG. 11, there is illustrated the exemplary IC chip of FIG. 10 after forming a third electrode 32. In the illustrated embodiment, the third electrode 32 is formed first utilizing the technique mentioned above in forming the first electrode.

Notably, the third electrode 32 is formed by providing a third electrode-containing material layer on a physically exposed surface of the second capacitor dielectric material layer 30, and then patterning the third electrode-containing material layer by lithography and etching. The third electrode-containing material layer that is used in providing the third electrode 32 may be composed of one of the conductive metals or conductive metal nitrides mentioned above for the first electrode-containing material layer. In one embodiment, the third electrode-containing material layer that provides the third electrode 32 is composed of a same conductive material as the first electrode-containing material layer that provides the first electrode 20 and/or the second electrode-containing material layer that provides the second electrode 26. In another embodiment, the third electrode-containing material layer that provides the third electrode 32 is composed of a different conductive material than the first electrode-containing material layer that provides the first electrode 20 and/or the second electrode-containing material layer that provides the second electrode 26. The third electrode-containing material layer that is used in providing the third electrode 32 may have a thickness from 10 nm to 50 nm; although other thicknesses are contemplated and can be used in the present application.

In the formation of MIM plate electrode 32 the patterning, masking and etching process steps applied to the electrode-containing material layer are further adapted to form an e-fuse structure dimensioned to provide a fusing location at or near the plate electrode 32. In embodiments, during the patterning of the MIMcap electrode 32 by lithography the via plate e-fuse contact portion and or neck e-fuse structures of FIGS. 1A-5B are patterned and etching is used to form the e-fuse contact portion and or neck e-fuse structures such that an open occurs at the fusing location(s) defined by the e-fuse structures when a high current passes therethrough thereby disconnecting the MIM capacitor or electrode plate from the active circuitry. In this embodiment, the effuse structure is formed as an extension of the electrode 32 beyond the electrode connection to an inter-level interconnect via.

In the illustrated embodiment, elements 20/24/26/30/32 collectively provide a MIM capacitor that contains three planar electrodes (20/26/32) in which a capacitor dielectric (24/30) is located between each of the electrodes (20/26/32) and which one or more are formed with a capacitor plate-electrode having an integral e-fuse element such as shown in FIGS. 1A-5A as co-processed therewith. Although a three electrode MIM capacitor is described and illustrated, a MIM capacitor including only two electrodes or more than three electrodes can be formed having e-fuse element co-processed therewith.

The structure allows easy control and low power programming in the level where more white spaces available to not extend chip size.

Referring now to FIG. 12, there is illustrated the exemplary IC chip of FIG. 11 expanded to show the additional electrically conductive structure 15 formed embedded in another portion of an interconnect dielectric material layer 12 beyond the conductive structure 14. FIG. 12 particularly depicts the structure of FIG. 11 after forming a second interconnect dielectric (ILD) material layer 36. The second ILD material layer 36 may include one of the dielectric materials mentioned above for the first ILD material layer 18. In one embodiment, the second ILD material layer 36 can be composed of a same dielectric material as the first ILD material layer 18. In one embodiment, the second ILD material layer 36 may be composed of different dielectric material as the first ILD material layer 18. The second ILD material layer 36 may be formed utilizing one of the deposition techniques mentioned above for forming the first ILD material layer 18. The second ILD material layer 36 may have a thickness within the thickness range mentioned above for the first ILD material layer 18 as long as thickness of the second ILD material is sufficient to cover the entirety of the MIM capacitor.

Figure 13:
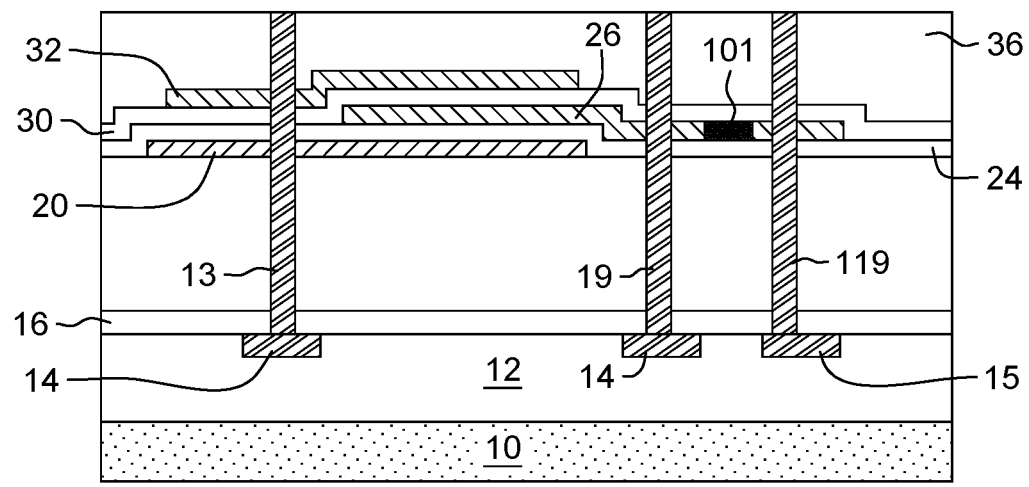
FIG. 13 is a cross sectional view of the exemplary IC chip of FIG. 12 after forming metal or metal alloy contact structures that are formed to extend down to a surface of one of the underlying electrically conductive structures.

Referring now to FIG. 13, there is illustrated exemplary IC chip of FIG. 12 after forming metal or metal alloy contact structures 13, 19, 119. Each metal or metal alloy contact structure 13, 19 that is formed extend down to a surface of one of the underlying electrically conductive structures 14. The metal or metal alloy contact structure 119 that is formed extends down to a surface of the underlying electrically conductive structure 15. Each metal or metal alloy contact structure 13, 19, 119 has a topmost surface that is typically coplanar with a topmost surface of the second ILD material layer 36.

As shown in FIG. 13, the metal or metal alloy contact structures 13, 19, 119 can be formed by forming contacting openings with the second ILD material 36, the MIM capacitor, the first ILD material layer 18 and, if present, the dielectric capping layer stopping on a surface of the electrically conductive structures 14, 15 and then filling each opening with a contact metal or metal alloy. The contact metal or metal alloy that provides each metal or metal alloy contact structures 13, 19, 119 may include one of the conductive materials mentioned above for the electrically conductive structures 14, 15. In one embodiment, the metal or metal alloy contact structures 13, 19, 119 may be composed of a same conductive material as the electrically conductive structures 14, 15. In another embodiment, the metal or metal alloy contact structures 13, 19, 119 may be composed of different conductive material than the electrically conductive structures 14, 15. The filling of the contact openings may include one of the deposition techniques mentioned above in forming the electrically conductive structures 14, 15. A planarization process may follow the deposition of the contact metal or metal alloy that provides the metal or metal alloy contact structures 13, 19, 119. In some embodiments, the metal or metal alloy contact structures 13, 19, 119 have vertical sidewalls that are essentially perpendicular to (90°±2°) a topmost surface of the semiconductor substrate 10. In other embodiments, the metal or metal alloy contact structures 13, 19, 119 may have tapered sidewalls such that the width of the metal or metal alloy contact structures 13, 19, 119 decreased from top to bottom.

Although the illustrated embodiment depicts a single damascene metal or metal alloy contact 13, 19, 119, dual damascene metal or metal alloy contact structures can also be employed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
  a metal-insulator-metal (MIM) capacitor ("MIMcap") having two or more electrodes, a first electrode located on a topmost surface of a first dielectric material layer, a first capacitor dielectric located on the first electrode, a second electrode located on the first capacitor dielectric, a second capacitor dielectric located on the second electrode, a portion of the second electrode overlapping a portion of the first electrode;

a second dielectric material layer located over the MIM capacitor and the first dielectric material layer;
a first upper interconnect structure extending through the second dielectric material layer and the first dielectric material layer to vertically contact a first lower interconnect structure embedded in a portion of a lower interconnect dielectric material layer disposed below said first dielectric material layer, wherein the first upper interconnect structure laterally contacts the second electrode at a first end of the MIM capacitor; and
a second upper interconnect structure extending through the second dielectric material layer and the first dielectric material layer to vertically contact a second lower interconnect structure embedded in another portion of the lower interconnect dielectric material layer; and
an integral portion of the second electrode extending laterally beyond the first end of the MIM capacitor to define a fusing element, said fusing element having a first end portion laterally contacting the first upper interconnect structure and a second end portion laterally contacting the second upper interconnect structure.

2. The semiconductor structure as claimed in claim 1, wherein the second end portion includes an edge having a surface contacting second upper interconnect structure, said fusing element providing a fusing location at a point where the second end portion edge surface laterally contacts second upper interconnect structure.

3. The semiconductor structure as claimed in claim 1, wherein the second end portion laterally contacting comprises said second end portion surrounding said second upper interconnect structure, said fusing element comprising a neck portion between said first end portion and second end portion of said fusing element, the fusing element providing a fusing location along said neck portion between the first upper interconnect structure and the second upper interconnect structure.

4. The semiconductor structure as claimed in claim 1, wherein the second end portion laterally contacting comprises said second end portion surrounding said second upper interconnect structure, said fusing element comprising two or more neck portions between said first end portion and second end portion of said fusing element, the fusing element providing a fusing location at each said two or more neck portions between the first upper interconnect structure and the second upper interconnect structure.

5. The semiconductor structure as claimed in claim 1, wherein said fusing element comprises a neck portion between said first end portion and second end portion of said fusing element, said neck portion having a first linear portion extending from said first end portion of said fusing element, a second linear portion connecting the first linear portion, and a third linear portion connecting said second linear portion and extending to said second portion of said fusing element, said first, second and third linear portions lying substantially parallel relative to each other such that the fusing element provides a fusing location at said second linear portion.

6. The semiconductor structure as claimed in claim 3, wherein the MIM capacitor is a first MIMcap, the semiconductor structure further comprising:
a second MIMcap connected in parallel with the first MIMcap, the second MIMcap having first and second electrodes, a first electrode of the second MIMcap located on the topmost surface of the first dielectric material layer, the first capacitor dielectric located on the first electrode of the second MIMcap, a second electrode of the second MIMcap located on the first capacitor dielectric, a portion of the second capacitor dielectric located on the second electrode of the second MIMcap, a portion of the second electrode of the second MIMcap overlapping a portion of the first electrode of the second MIMcap;
a third upper interconnect structure extending through the second dielectric material layer and the first dielectric material layer to vertically contact a third lower interconnect structure embedded in another portion of the lower interconnect dielectric material layer, wherein the third upper interconnect structure laterally contacts a first end of the first electrode of the second MIM capacitor; and
the second electrode of said second MIMcap comprising:
an integral extension of said second end portion of said fusing element laterally contacting and surrounding said second upper interconnect structure that extends beyond the second upper interconnect structure to overlap with said portion of the first electrode of the second MIMcap.

7. A semiconductor structure comprising:
a metal-insulator-metal (MIM) capacitor ("MIMcap") having a bottom electrode located on a topmost surface of a first dielectric material layer, a first capacitor dielectric located on the bottom electrode, a middle electrode located on the first capacitor dielectric, a second capacitor dielectric located on the middle electrode and a top electrode located on the second capacitor dielectric, a portion of the middle electrode in overlapped relation with a portion of the bottom electrode and a portion of the top electrode;
a second dielectric material layer located over the MIM capacitor and the first dielectric material layer;
a first upper interconnect structure extending through the second dielectric material layer and the first dielectric material layer to vertically contact a first lower interconnect structure embedded in a portion of an interconnect dielectric material layer disposed below said first dielectric material layer, wherein the first upper interconnect structure laterally contacts the middle electrode at a first end of the MIM capacitor; and
a second upper interconnect structure extending through the second dielectric material layer and the first dielectric material layer to vertically contact a second lower interconnect structure embedded in another portion of the interconnect dielectric material layer; and
an integral portion of the middle electrode extending laterally beyond the first end of the MIM capacitor to define a fusing element, said fusing element having a first end portion laterally contacting the first upper interconnect structure and a second end portion laterally contacting the second upper interconnect structure.

8. The semiconductor structure as claimed in claim 7, wherein the second end portion includes an edge having a surface contacting second upper interconnect structure, said fusing element providing a fusing location at a point where the second end portion edge surface laterally contacts said second upper interconnect structure.

9. The semiconductor structure as claimed in claim 7, wherein the second end portion laterally contacting comprises said second end portion surrounding said second upper interconnect structure, said fusing element comprising a neck portion between said first end portion and second end portion of said fusing element, the fusing element providing a fusing location along said neck portion between the first upper interconnect structure and the second upper interconnect structure.

10. The semiconductor structure as claimed in claim 7, wherein the second end portion laterally contacting comprises said second end portion surrounding said second upper interconnect structure, said fusing element comprising two or more neck portions between said first end portion and second end portion of said fusing element, the fusing element providing a fusing location at each said two or more neck portions between the first upper interconnect structure and the second upper interconnect structure.

11. The semiconductor structure as claimed in claim 7, wherein the second end portion laterally contacting comprises said second end portion surrounding said second upper interconnect structure, said fusing element comprising a neck portion between said first end portion and second end portion of said fusing element, said neck portion having a first linear portion extending from said first end portion of said fusing element, a second linear portion connecting the first linear portion, and a third linear portion connecting said second linear portion and extending to said second portion of said fusing element, said first, second and third linear portions lying substantially parallel relative to each other such that the fusing element provides a fusing location at said second linear portion.

12. The semiconductor structure as claimed in claim 9, wherein the MIM capacitor is a first MIMcap, the semiconductor structure further comprising:
a second MIMcap connected in parallel with the first MIMcap, the second MIMcap having a bottom electrode located on a topmost surface of a first dielectric material layer, a first capacitor dielectric located on the bottom electrode, a middle electrode located on the first capacitor dielectric, the second capacitor dielectric located on the middle electrode and a top electrode located on the second capacitor dielectric, a portion of the middle electrode in overlapped relation with a portion of the bottom electrode and a portion of the top electrode of said second MIMcap;
the second dielectric material layer located over the second MIM capacitor and the first dielectric material layer;
a third upper interconnect structure extending through the second dielectric material layer and the first dielectric material layer to vertically contact a third lower interconnect structure embedded in another portion of the interconnect dielectric material layer, wherein the third upper interconnect structure laterally contacts the middle electrode at a first end of the second MIM capacitor; and
the middle electrode of said second MIMcap comprising:
an integral extension of said second end portion of said fusing element laterally contacting and surrounding said second upper interconnect structure that extends beyond the second upper interconnect structure to overlap with said portion of the bottom electrode and top electrode of said second MIMcap.

13. A semiconductor structure comprising:
a first metal-insulator-metal (MIM) capacitor ("first MIMcap") having a bottom electrode located on a topmost surface of a first dielectric material layer, a first capacitor dielectric located on the bottom electrode, a middle electrode located on the first capacitor dielectric, a second capacitor dielectric located on the middle electrode and a top electrode located on the second capacitor dielectric, a portion of the middle electrode in overlapped relation with a portion of the bottom electrode and a portion of the top electrode;
a second dielectric material layer located over the MIM capacitor and the first dielectric material layer;
a first conductive via structure extending through the second dielectric material layer and the first dielectric material layer to vertically contact a first lower interconnect structure embedded in a portion of a first an interconnect dielectric material layer disposed below the first dielectric material layer, wherein the first conductive via structure laterally contacts the middle electrode at a first end of the first MIM capacitor;
a second MIMcap connected in parallel with the first MIMcap, the second MIMcap having a bottom electrode located on a topmost surface of the first dielectric material layer, a first capacitor dielectric located on the bottom electrode, a middle electrode located on the first capacitor dielectric, the second capacitor dielectric located on the middle electrode and a top electrode located on the second capacitor dielectric, a portion of the middle electrode in overlapped relation with a portion of the bottom electrode and a portion of the top electrode of said second MIMcap, the second dielectric material layer located over the second MIM capacitor and the first dielectric material layer;
a second conductive via structure extending through the second dielectric material layer and the first dielectric material layer to vertically contact a second lower interconnect structure embedded in another portion of the interconnect dielectric material layer, wherein the second conductive via structure laterally contacts the middle electrode at a first end of the first MIM capacitor; and
the middle electrode of said first MIMcap and parallel connected second MIMcap being an integral unitary structure; and
an integral portion of the middle electrode of said first MIMcap and parallel connected second MIMcap comprising a fusing element, said fusing element having a first end portion laterally contacting the first conductive via structure and a second end portion laterally contacting second conductive via structure.

14. The semiconductor structure as claimed in claim 13, wherein the first end portion of the fusing element laterally contacting the first conductive via structure laterally surrounds the first conductive via structure and second end portion of the fusing element laterally contacting the second conductive via structure laterally surrounds the second conductive via structure.

15. The semiconductor structure as claimed in claim 14, wherein said fusing element comprises a neck portion between said first end portion and second end portion of said fusing element, the fusing element providing a fusing location along said neck portion between the first conductive via structure and the second conductive via structure.

16. The semiconductor structure as claimed in claim 14, wherein said fusing element comprises: two or more neck portions between said first end portion and second end portion of said fusing element, the fusing element providing a fusing location at each said two or more neck portions between the first upper interconnect structure and the second upper interconnect structure.

17. The semiconductor structure as claimed in claim 14, wherein said fusing element comprises: a neck portion between said first end portion and second end portion of said fusing element, said neck portion having a first linear portion extending from said first end portion of said fusing element, a second linear portion connecting the first linear portion, and a third linear portion connecting said second linear portion and extending to said second portion of said fusing element, said first second and third linear portions lying substantially parallel relative to each other such that the fusing element provides a fusing location at said second linear portion.

18. The semiconductor structure as claimed in claim 14, further comprising:
a third conductive via structure extending through the second dielectric material layer and the first dielectric material layer to vertically contact a third lower interconnect structure embedded in a further portion of the interconnect dielectric material layer, wherein, the middle electrode of the first MIMcap including a portion extending to said third conductive via structure and having a cut-out region such that said first MIMcap middle electrode surrounds the third conductive via structure without contacting the third conductive via structure.

19. The semiconductor structure as claimed in claim 18, further comprising:
a fourth conductive via structure extending through the second dielectric material layer and the first dielectric material layer to vertically contact a fourth lower interconnect structure embedded in a another further portion of the interconnect dielectric material layer, wherein, the middle electrode of the second MIMcap including a portion extending to said fourth conductive via structure and having a cut-out region such that said second MIMcap middle electrode surrounds the fourth conductive via structure without contacting the fourth conductive via structure.

20. The semiconductor structure of claim 13, wherein each of the bottom electrode, the middle electrode and the top electrode comprises a material selected from a group of materials comprising: Ti, TiN, Ta, TaN, or Cu, Al, or W.

* * * * *